(12) United States Patent
Mayer et al.

(10) Patent No.: US 7,709,266 B2
(45) Date of Patent: May 4, 2010

(54) FAST METABOLIC IMAGING OF SYSTEMS WITH SPARSE SPECTRA USING SPIRAL CSI

(75) Inventors: Dirk Mayer, Menlo Park, CA (US); Yakir Levin, Palo Alto, CA (US); Daniel Spielman, Menlo Park, CA (US); Ralph Eugene Hurd, Milpitas, CA (US)

(73) Assignees: The Board of Trustees of the Leland Stanford Junior University, Palo Alto, CA (US); General Electric Company, Schenectady, NY (US)

( * ) Notice: Subject to any disclaimer, the term of this patent is extended or adjusted under 35 U.S.C. 154(b) by 888 days.

(21) Appl. No.: 11/469,801

(22) Filed: Sep. 1, 2006

(65) Prior Publication Data

US 2008/0057587 A1    Mar. 6, 2008

(51) Int. Cl.
*G01N 24/00* (2006.01)
(52) U.S. Cl. .................................... 436/173; 600/410
(58) Field of Classification Search .................. None
See application file for complete search history.

(56) References Cited

OTHER PUBLICATIONS

Månsson et al. "Metabolic Imaging with Hyperpolarized 13C and Multi-echo, Single-shot RARE" publication on-line http://www.imagnia.se/00584.pdf, Nov. 2005.*
Wear et al. "Constrained Reconstruction Applied to 2-D Chemical Shift Imaging", IEEE Trans. Med. Imag., Oct. 1997 vol. 16, No. 5, pp. 591-597.*
Gao et al. "Fast Chemical Shift Imaging by Online Optimal Sparse k-space Acquisition And Projection Onto Convex Set Reconstruction", Proc. Intl. Soc. Mag. Reson. Med., 2005, v. 13, p. 284.*
Kim et al. "Short Echo Time Spiral Chemical Shift Imaging", Proc. Intl. Soc. Mag. Reson. Med., 2004, v. 11, p. 2287 http://cds.ismrm.org/ismrm-2004/Files/002287.pdf.*

Mayer et al., "Fast Metabolic Imaging of Systems with Sparse Spectra: Application for Hyperpolarized 13C Imaging", ISMRM Poster, ISMRM 14th Scientific Meeting & Exhibition, Seattle, Washington, USA May 6-12, 2006.
Mayer et al., "Fast Metabolic Imaging of Systems with Sparse Spectra: Application for Hyperpolarized 13C Imaging", Abstract from Magnetic Resonance in Medicine, vol. 56, Issue 4 , pp. 932-937, Published Online: Aug. 29, 2006.
Golman, et al, "Molecular imaging using hyperpolarized 13C", The British Journal of Radiology, 76 (2003), S118-S127.
Golman, et al, "Molecular imaging with endogenous substances", PNAS Sep. 2, 2003, vol. 100, No. 18, 10435-10439.
Levin et al., "Least Squares Reconstruction for Sparse Spectra: Application to Hyperpolarized 13C Imaging" , Abstract from ISMRM 14th Scientific Meeting & Exhibition, Seattle, Washington, USA May 6-12, 2006.
Ardenkjær-Larsen et al., "Increase in signal-to-noise ratio of >10,000 times in liquid-state NMR", 10158-10163, PNAS, Sep. 2, 2003, vol. 100, No. 18.
Levin et al., "Least Squares Reconstruction for Sparse Spectra: Application to Hyperpolarized 13C Imaging", Poster from ISMRM 14th Scientific Meeting & Exhibition, Seattle, Washington, USA May 6-12, 2006.

* cited by examiner

*Primary Examiner*—Yelena G Gakh
(74) *Attorney, Agent, or Firm*—Beyer Law Group LLP

(57) ABSTRACT

A method of imaging the individual components of systems with sparse spectra using magnetic resonance imaging including the steps of a) exciting nuclei of labeled components using a MRI pulse sequence, b) selecting a proper spectral window to avoid/minimize signal overlap of aliased frequency components. In step a) preferably a spiral chemical shift imaging (spCSI) sequence is employed. In a preferred embodiment, hyperpolarized nuclei of $^{13}C$ are used for labeling in a pyruvate substrate with metabolites of lacatate, alanine, and bicarbonate.

12 Claims, 10 Drawing Sheets

FAST METABOLIC IMAGING OF SYSTEMS WITH SPARSE SPECTRA USING SPIRAL CSI

STATEMENT REGARDING FEDERALLY SPONSORED RESEARCH OR DEVELOPMENT

The U.S. government has rights in the claimed invention pursuant to NIH Grant Nos. RR009784, CA048269, and AA12388 to Stanford University.

BACKGROUND OF THE INVENTION

This invention relates generally to magnetic resonance spectroscopy (MRS), and more particularly the invention relates to rapid chemical shift imaging of metabolically active substances.

Nuclear magnetic resonance (NMR) has been applied to spectroscopy as an analytical technique in obtaining information about molecular structure, dynamics, and molecular interactions. However, until recently the application of MRS in vivo has been limited by low sensitivity due to low magnetic energy of nuclear spins compared with thermal energy at room temperature.

Recently, hyperpolarization techniques have greatly increased the detection sensitivity of nuclear spins other than protons which enables fast imaging of these nuclei. Their molecular distribution in vivo can be visualized in a clinically relevant time window. See Golman et al., Molecular Imaging Using Hyperpolarized $^{13}$C, The British Journal of Radiology, Special Issue, 2003.

With signal-to-noise ratio (SNR) enhancements on the order of the 100,000-fold, dynamic nuclear polarization of metabolically active substrates (e.g., $^{13}$C-labeled pyruvate or acetate) theoretically permits in vivo imaging of not only the injected agent, but also downstream metabolic products. This feature of hyperpolarized MR spectroscopy provides a unique chance to non-invasively monitor critical dynamic metabolic processes in vivo under both normal and pathologic conditions. Important applications include tumor diagnosis and treatment monitoring as well as assessment of cardiac function.

When using hyperpolarized samples, the magnetization decays towards its thermal equilibrium value and the enhanced signal is not recoverable. Therefore, fast acquisition schemes are important. Furthermore, due to very low natural abundance of $^{13}$C combined with its low degree of polarization at thermal equilibrium, virtually no background signal is present. Depending on the substrate, this can produce relatively sparse spectra as is the case for a bolus injection of hyperpolarized [1-$^{13}$C] pyruvate where the metabolic products detectable by $^{13}$C-MRS comprise lactate, alanine, and bicarbonate. While a number of fast spectroscopic imaging methods have been proposed for more general in vivo MRS applications, the need for high speed in data acquisition combined with the limited spectral content restrict known spectroscopic imaging methods for hyperpolarized agents.

SUMMARY OF THE INVENTION

The present invention utilizes a fast spiral chemical shift imaging (spCSI) sequence for use in systems with sparse spectra, such as provided by hyperpolarized imaging agents.

The sequence utilizes knowledge of resonance frequencies to reduce the measurement time by undersampling the data in the spectral domain. Multiple reconstructions have to be performed in which only components with frequencies within a certain bandwidth are reconstructed properly while other components are blurred.

In the imaging of a plurality of metabolic products such as alanine, lacatate and pyruvate-pyruvate hydrate C1-C2 ester enriched with $^{13}$C in the C1 carbonyl positions, the spectral width can be chosen so that none of the aliased resonances leads to signal overlap.

In accordance with another embodiment of the invention, an alternative reconstruction technique based on a least squares algorithm allows the user to include additional a priori knowledge in the reconstruction of the data to enhance acquisition parameters and minimize acquisition time.

The invention and object and features thereof will be more readily apparent from the following detailed description and appended claims when taken with the drawings.

DETAILED DESCRIPTION OF ILLUSTRATIVE EMBODIMENTS

The invention will be described with reference to one embodiment of hyperpolarized MR spectroscopy in which $^{13}$C labeled lacatate (Lac), alanine (Ala), and pyruvate-pyruvate hydrate C1-C2 ester (PPE1, PPE2) are imaged.

Figure 1:
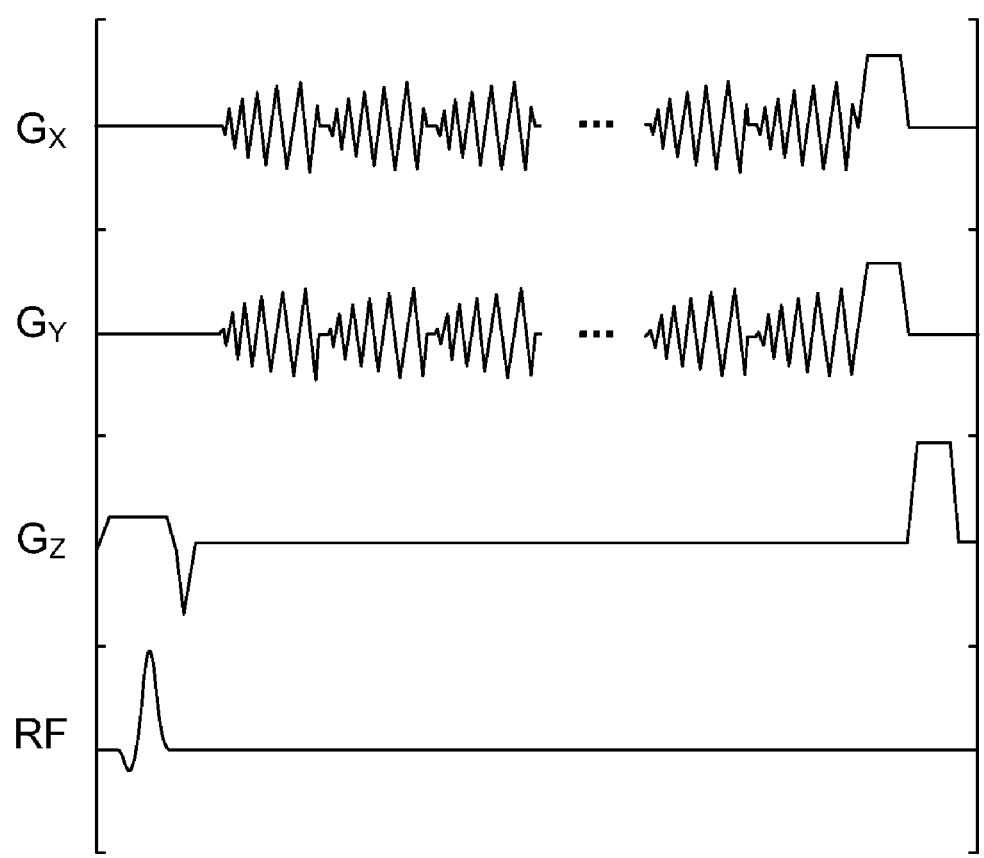
FIG. 1 illustrates a spiral CSI pulse (spCSI) sequence as used in an embodiment of the invention.

In accordance with a feature of the invention, a spiral chemical shift imaging (spCSI) sequence is employed for rapid collection of the sparse spectra. Such a sequence is illustrated in FIG. 1 for a single shot or a three-shot. The sequence is designed for a slice-selective excitation pulse.

Spiral CSI Pulse Sequence has a slice-selective excitation pulse—duration of 1.8 ms, flip angle: 23°, and slice thickness: 5.4 mm, the spiral waveform design has a FOV=8×8 cm$^2$, 16×16 matrix. A single-shot spCSI has 1 spatial interleaf, 32 spiral lobes, with SW=109.7 Hz and NEX=60. A 3-shot spCSI has 3 spatial interleaves, 64 lobes, SW=276.2 Hz and NEX=20. Repetition time, TR, is TR=2 s, 8 dummy excitations for total acquisition time: 2:16 min. Only the data acquired during the first 21 (single-shot spCSI) and 52 (3-shot spCSI) echoes were used for the presented data. This corresponds to a minimum total time for excitation and readout of just less than 200 ms which is desirable for any application requiring high temporal resolution.

In the implemented $^{13}$C spCSI sequence, the data acquisition is carried out while a series of oscillating gradient waveforms are applied in both the x- and y-directions, sampling the data simultaneously in (kx, ky, kf). Each spiral gradient waveform, designed using an analytic algorithm, is followed by a rewinding gradient lobe in order to return the k-space trajectory to the (kx, ky)-origin. While the data is sampled equidistantly in kf, a gridding algorithm (10) is applied to interpolate the data onto a Cartesian grid in (kx, ky). As chemical shift (CS) evolves during the readout while the data are sampled in (kx, ky), spectral and spatial information are mixed which leads to spatial blurring for off-resonance components (CS artifact), if not corrected in the reconstruction algorithm. The blurring artifact increases with the degree of off-resonance.

All measurements were performed on a GE 3 T MR scanner equipped with self-shielded gradients (40 mT/m, 150 mT/m/ms). A doubly-tuned (1H/13C) birdcage coil (Ø=44 mm) was used for both RF excitation and signal reception. The sequence was tested on a phantom consisting of three 2-ml vials (Ø=10 mm) containing approximately 1.5-M 13C-enriched solutions of alanine (Ala, tube 1), lactate (Lac, tube 2), and pyruvate-pyruvate hydrate C1-C2 ester (tube 3), all enriched to 99% 13 C in the C1 carbonyl positions. The ester has 2 resonances with frequency offsets relative to Lac of approximately −243 Hz (PPE1) and −592 Hz (PPE2), respectively. The implemented sequence consists of a slice(z)-selective excitation (5.4 mm) and a spiral readout gradient for combined spatial(xy)-spectral(f) encoding. The spiral waveforms were designed for a FOV of 80×80 mm$^2$ with nominal 5×5-mm$^2$ in-plane resolution using an analytic algorithm (4). The spectral width (SW) was 109.7 Hz in single-interleaf mode (single-shot spCSI) and could be increased to 276.2 Hz when performing 3 spatial interleaves (3-shot spCSI). In order to increase the SNR, 60 and 20 accumulations were carried out for the two acquisition schemes, respectively. With a TR of 2 s and 8 dummy excitations, the total acquisition time ($T_{acq}$) was 2:16 min. The spCSI experiments were compared to conventional phase-encoded pulse-acquire CSI (FIDCSI) with the same spatial parameters ($T_{acq}$=8:48 min).

Apodization of the spCSI data comprised a 5-Hz Gaussian line broadening and zero-padding up to 128 points in kf, and multiplication with a generalized Hamming window and zero-padding up to 32×32 pixels in kx and ky. After FFT along kf, a frequency-dependent linear phase-correction was applied along the readout in order to remove the chemical shift (CS) artifact. As this can not simultaneously be done for spectral components that have been aliased a different number of times, multiple data sets were reconstructed in which only components with resonance frequencies within a certain bandwidth are reconstructed "in-focus" while components outside of that band are severely blurred ("spectral tomosynthesis"). After gridding the data, a 2D-FFT was performed. Metabolic maps for Ala, Lac, PPE1, and PPE2 were calculated by integrating the signal within a 28-Hz interval around each peak in absorption mode and normalized to the maximum intensity in the PPE2 map.

Figure 2:
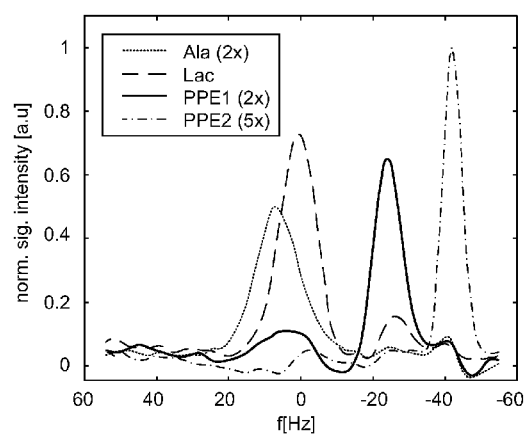
FIG. 2 illustrates four single shot spCSI spectra.
Figure 3:
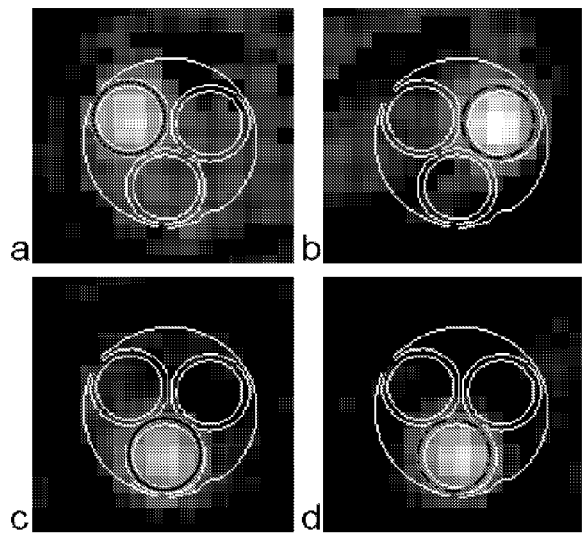
FIG. 3 illustrates metabolic maps of metabolic reconstructed from a single shot data set for the spectra of FIG. 2.
Figure 4:
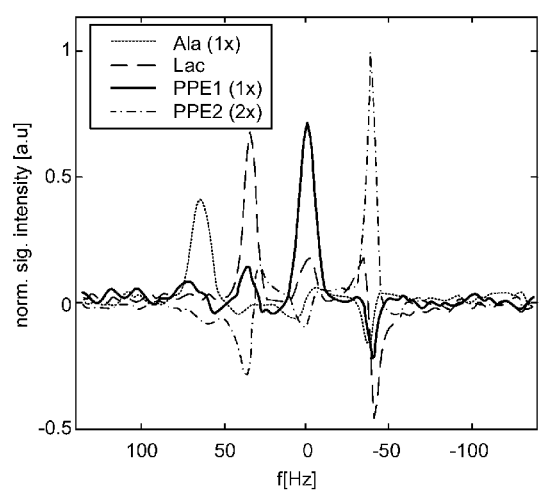
FIG. 4 illustrates four three-shot spCSI spectra.
Figure 5:
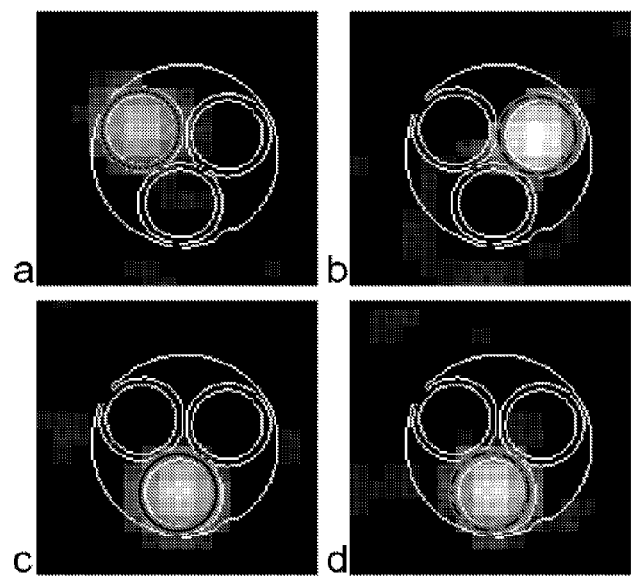
FIG. 5 illustrates metabolic maps reconstructed from a three-shot data set for the spectra of FIG. 4.

Spectra acquired with single-shot spCSI from voxels located in each of the three respective tubes are shown in FIG. 2. The different line widths of the peaks are mainly due to scalar $^{13}$C—$^1$H-coupling. The multiplet structure is not resolved due to the strong apodization. With the resonance frequency set to Lac, the signals from Ala and PPE1 were aliased twice and, hence, were detected at 8 Hz and −23 Hz, respectively. The PPE2 resonance was aliased five times and detected at −43 Hz. While both ester resonances are well resolved, the Ala signal severely overlaps with Lac. But since Ala is aliased twice, its PSF is blurred when the appropriate linear phase correction is applied for the reconstruction of Lac. Therefore, most of the signal in the metabolic maps of these two metabolites (FIGS. 3a and 3b) falls within the respective tube, but on top of a broad, low intensity background signal. As both ester resonances are well resolved, the corresponding metabolic maps (FIGS. 3c and 3d) are similar to the ones measured with FIDCSI (FIG. 6b-e). Due to the higher SW in the 3-shot acquisition, all 4 resonances are well resolved (FIG. 4). The resonances of Ala, PPE1, and PPE2 alias to frequencies 64 Hz, −33 Hz, and −40 Hz, respectively. The metabolic maps for all four resonances (FIG. 5) demonstrate similar resolution and localization properties as the FIDCSI images. Relative difference in amplitude ratios as measured with single-shot spCSI compared to FIDCSI are 12% for Ala/PPE2, 6% for Lac/PPE2, and 9% for PPE1/PPE2. Respective values for 3-shot spCSI are 11% for Ala/PPE2, 14% for Lac/PPE2, and 8% for PPE1/PPE2. As confirmed by simulations, the main causes of the deviations are dispersion-mode signal contributions of aliased peaks from different voxels.

Three additional $^{13}$C CSI experiments were performed: two spCSI acquisitions with different numbers of spatial interleaves, and for comparison a conventional excitation-acquire phase-encoded CSI (FIDCSI) experiment. The FOV was 80×80 mm$^2$ with a nominal 5×5-mm$^2$ in-plane resolution. A 1.8-ms minimum phase RF pulse (2289-Hz bandwidth) was used to excite a 5.4-mm slice along the z-direction.

In the FIDCSI experiment, the data acquisition started 2.9 ms after the end of the excitation pulse. 2048 complex data points were acquired at a SW of 2000 Hz for each of the 16×16 phase encoding steps. Due to the long longitudinal relaxation constants of the solutions (~10 s), a flip angle of 23° was used for excitation. With a TR of 2 s and 8 excitations performed without data acquisition to establish a steady state, the total experiment time was 8:48 min. The data were apodized in the spectral dimension with a 5-Hz Gaussian line broadening. Apodization in both spatial frequency dimensions comprised multiplication with a generalized Hamming window ($\alpha_{apo}$=0.66) and zero-padding up to 32×32 pixels. The data were reconstructed by performing a three-dimensional fast Fourier transform (FFT). Metabolic maps for Ala, Lac, PPE1, and PPE2 were calculated by integrating the signal within a 28-Hz interval around each peak in absorption mode and normalized to the maximum intensity in the PPE2 map.

The first spCSI experiment used a single spatial interleaf which allowed a SW of 109.7 Hz. Although 60 accumulations were carried out to increase the SNR, one excitation is sufficient to collect all necessary k-space data. The expectation is that when using hyperpolarized samples, the SNR will be sufficiently high to obviate the need for signal averaging. In the following, this experiment is therefore referred to as single-shot spCSI. Excitation flip angle, number of excitations without data acquisition, and TR were the same as in the FIDCSI experiment. Data acquisition started 6.1 ms after the end of the excitation pulse. Hardware restrictions limit the number of data points which can be sampled continuously at a readout bandwidth of 250 kHz to 16384. Therefore, no data were acquired over the duration of the rewinding gradient lobes. Trapezoidal crusher gradient lobes applied after data acquisition dephase any remaining transverse magnetization. 32 spiral gradient lobes were played out after each excitation, and the total experiment time was 2:16 min. For the calculation of spectra and metabolic images presented in the Results section, only the data acquired during the first 21 spiral lobes were used. This corresponds to a minimum total time for excitation and readout of just less than 200 ms which is desirable for any application requiring high temporal resolution. The data were apodized in the spectral dimension with a 5-Hz Gaussian line broadening and zero-padded up to 128 points. After performing a FFT along kf, a frequency-dependent linear phase correction was applied along the readout in order to remove the CS artifact. This was carried out with three different frequency offsets to account for aliased frequency components: 0 Hz, 2*SW, and 5*SW. This results in three reconstructed data sets for the experiment. After interpolating the data onto a Cartesian grid in (kx, ky), the data were apodized in the spatial frequency dimensions as with the FIDCSI data and a two-dimensional FFT was performed. Metabolic maps were calculated in the same manner as for the FIDCSI data.

The second spCSI experiment was carried out with three spatial interleaves (3 shot spCSI) at a SW of 276.2 Hz and with 20 accumulations. 64 spiral gradient lobes were played out after each excitation, but only the data acquired during the first 52 lobes, corresponding to a minimum TR of 200 ms, were used in post-processing. The frequency offsets used for removing the CS artifact were: 0 Hz, 1*SW, and 2*SW. Other acquisition and post-processing parameters were the same as for single-shot spCSI.

The experiments were accompanied by simulating the spCSI acquisition for the phantom used in the experiments. The positions of the tubes were measured in the high-resolution localizer image. Chemical shifts and $^{13}$C—$^{1}$H-coupling constants were taken from the FIDCSI data. The two ester resonances were treated as different components. An effective transverse relaxation time ($T_2^*$) corresponding to a line width of 1.5 Hz was used for all four resonances. The simulations were performed for amplitude ratios as measured with FIDCSI and for a set where the PPE1 amplitude is increased by a factor 20. Post-processing of the simulated data were the same as for experimental spCSI data.

Figure 6:
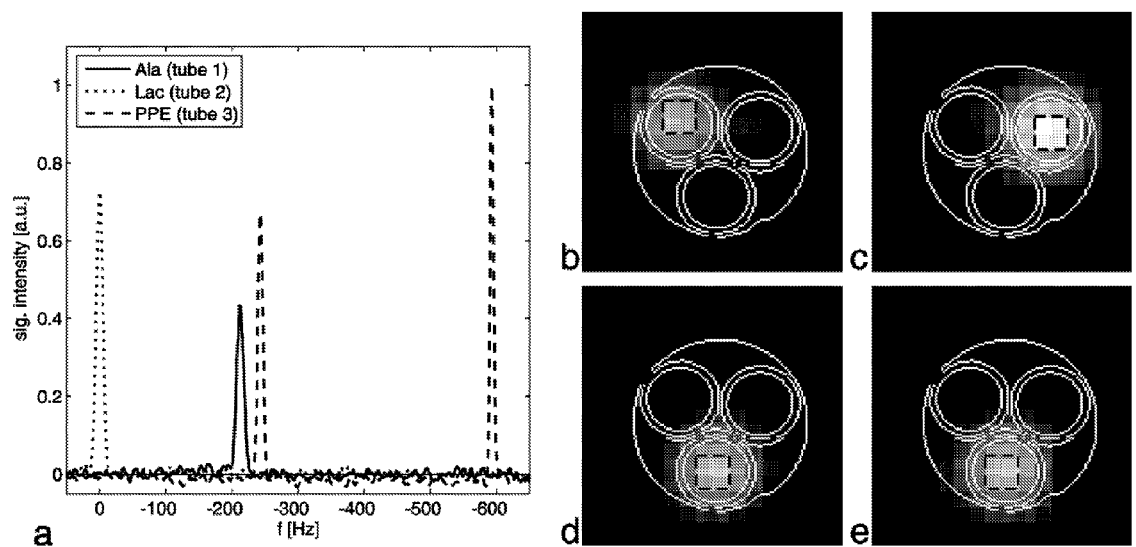
FIG. 6 illustrates (a) Absorption-mode spectra acquired with FIDCSI from voxels in tube 1 (solid), tube 2 (dotted), and tube 3 (dashed). Metabolic maps of Ala (b), Lac (c), PPE1 (d), and PPE2 (e) reconstructed from the FIDCSI data set. The four maps have the same intensity scale. Only a 40×40-mm2 part of the full FOV is displayed and the contours of the phantom derived from the high resolution proton image are outlined.

Absorption mode spectra acquired with FIDCSI from voxels located in each of the three respective tubes are shown in FIG. 6a. The different line widths of the peaks are mainly due to scalar $^{13}$C—$^{1}$H-coupling. While Lac and Ala split into quintets, the two ester resonances are quartets. The coupling constants were measured in the FIDCSI data set apodized with a 1-Hz line broadening and were approximately 4 Hz for Lac and Ala, 3 Hz for PPE1, and only 1.5 Hz for PPE2. The metabolic images, overlaid with the contour of the phantom as calculated from the high-resolution proton localizer image, are shown in FIG. 6b-e. Only the 40×40-mm$^2$ part of the full FOV centered on the phantom is displayed.

Figure 7:
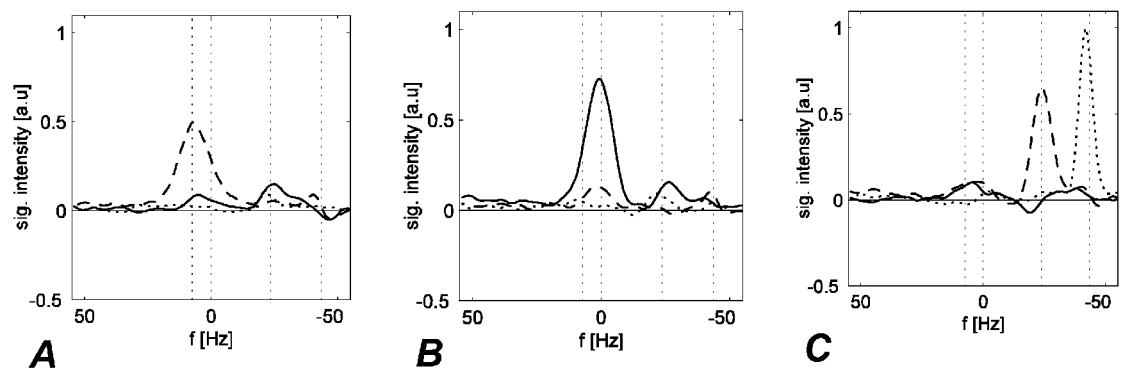
FIG. 7 illustrates spectra acquired with single-shot spCSI (SW=109.7 Hz) from voxels in tube 1 (a), tube 2 (b), and tube 3 (c). For each voxel, the data were reconstructed using a frequency offset of 0 Hz (solid), 2*SW (dashed), and 5*SW (dotted). The vertical dotted lines mark the resonance frequencies taking into account the aliasing of signal components outside the spectral width.
Figure 8:
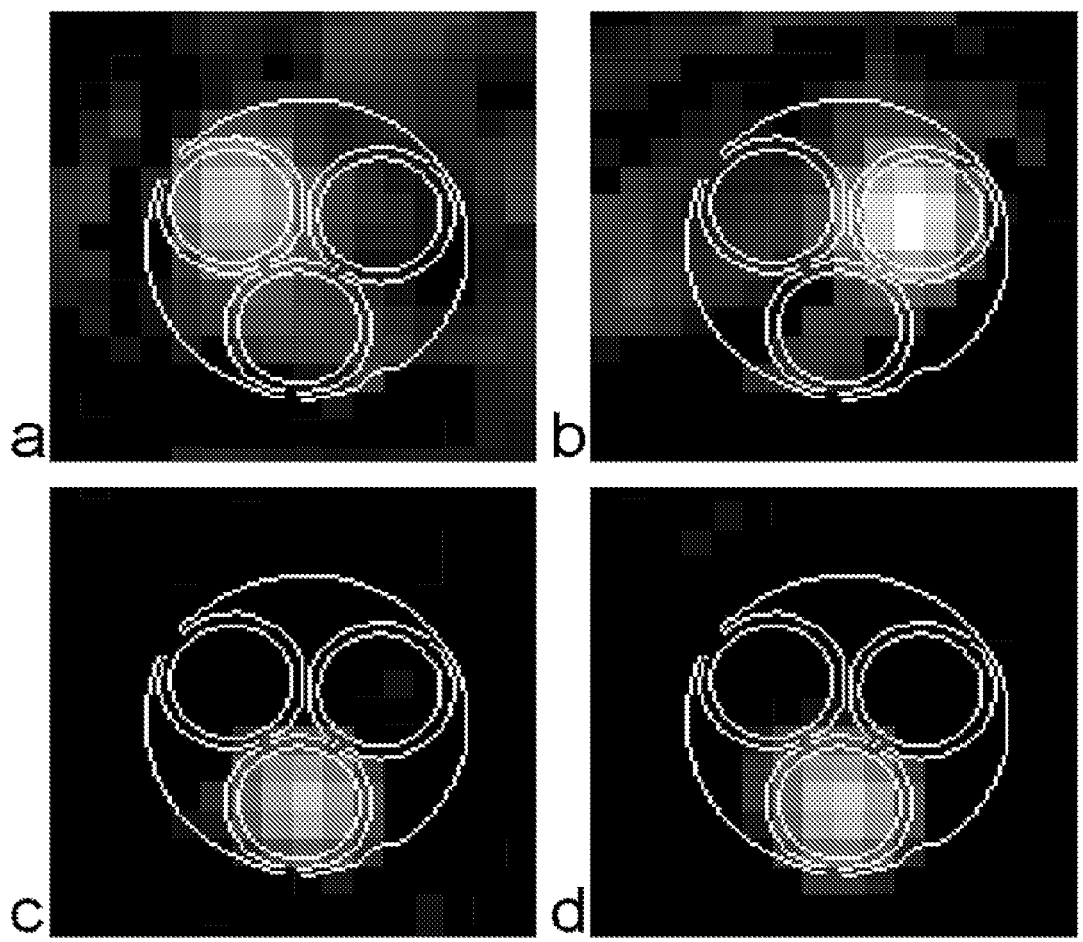
FIG. 8 illustrates metabolic maps of Ala (a), Lac (b), PPE1 (c), and PPE2 (d) reconstructed from the single-shot spCSI data set. The four maps have the same intensity scale. Only a 40×40-mm2 part of the full FOV is displayed and the contours of the phantom derived from the high resolution proton image are outlined.

Spectra acquired with single-shot spCSI from the same three voxels as in FIG. 6a are shown in FIG. 7. For each voxel, the three spectra corresponding to the three different frequency offsets applied while removing the CS artifact are plotted. With a SW of 109.7 Hz and the resonance frequency set to Lac, the signals from Ala and PPE1 were aliased twice and, hence, were detected at 8 Hz and −23 Hz, respectively. The PPE2 resonance was aliased five times and detected at −43 Hz. The frequencies are indicated by the vertical lines in the spectra. While both ester resonances are well resolved, the Ala signal severely overlaps with Lac. But since Ala is aliased twice, its PSF is blurred when the appropriate linear phase correction is applied for the reconstruction of Lac (solid line spectra), and vice versa (dashed line spectra). Therefore, most of the signal in the metabolic maps of these two metabolites (FIGS. 8a and 8b) falls within the respective tube, but on top of a broad, low intensity background signal. The metabolic images of PPE1 (FIG. 8c) and PPE2 (FIG. 8d) are similar to those acquired with FIDCSI.

Figure 9:
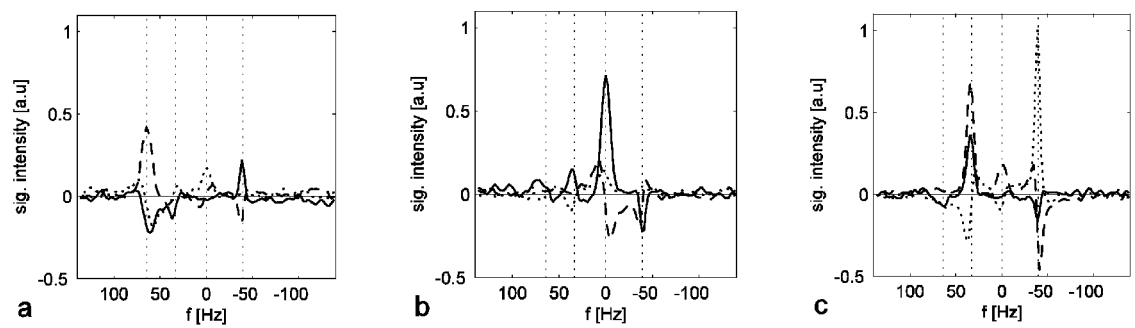
FIG. 9 illustrates spectra acquired with 3-shot spCSI (SW=276.2 Hz) from voxels in tube 1 (a), tube 2 (b), and tube 3 (c). For each voxel, the data were reconstructed using a frequency offset of 0 Hz (solid), 1*SW (dashed), and 2*SW (dotted). The vertical dotted lines mark the frequencies of the metabolite signals taking into account the aliasing of signal components outside the spectral width.
Figure 10:
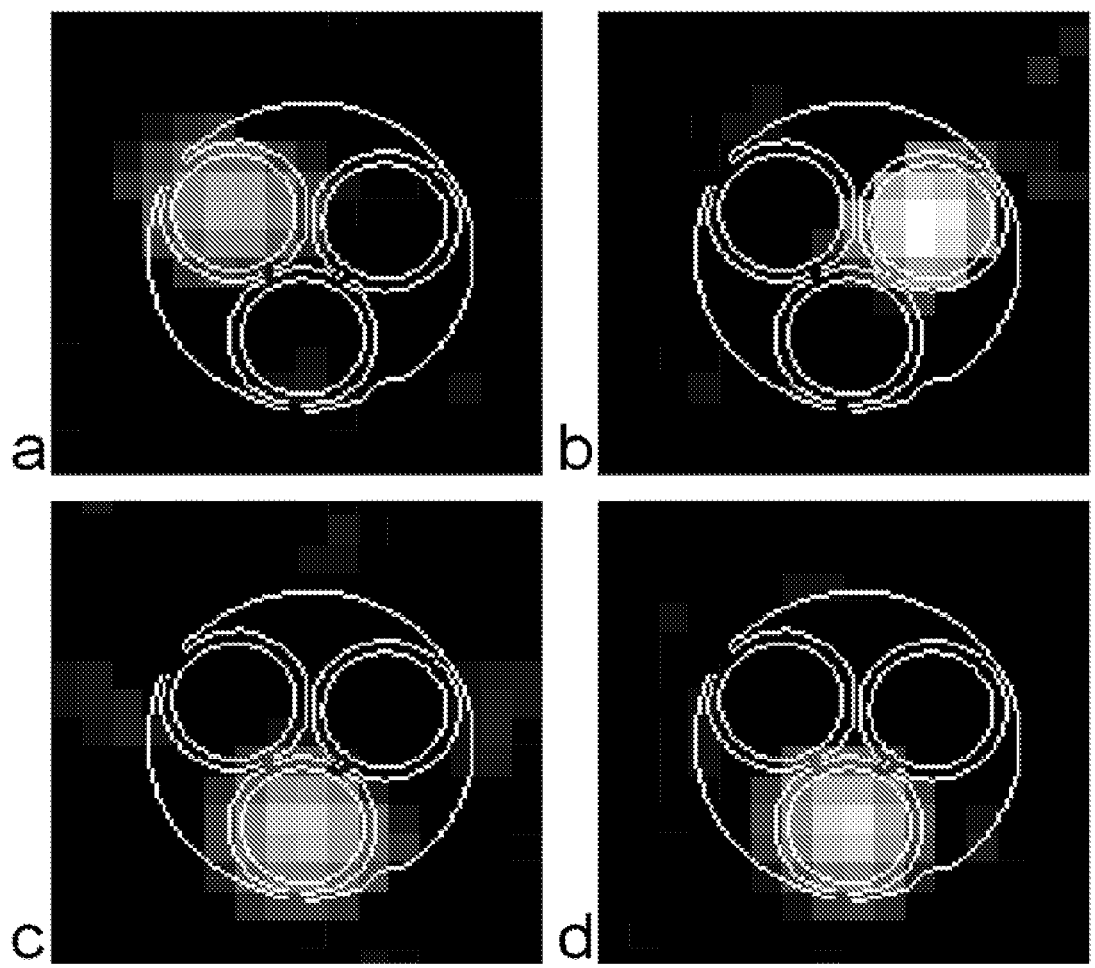
FIG. 10 illustrates metabolic maps of Ala (a), Lac (b), PPE1 (c), and PPE2 (d) reconstructed from the 3-shot spCSI data set. The four maps have the same intensity scale. Only a 40×40-mm2 part of the full FOV is displayed and the contours of the phantom derived from the high resolution proton image are outlined.

Data from the 3-shot acquisition are shown in FIGS. 9 and 10. The spectra in FIG. 9 are from the same three voxels as the FIDSCI spectra. With a spectral width of 276.2 Hz, the resonances of Ala, PPE1, and PPE2 alias to frequencies 64 Hz, −33 Hz, and −40 Hz, respectively, relative to Lac. Therefore, all four resonances are well resolved. One example for the distorted PSF of an aliased frequency component is the negative PPE2 signal detected in the Lac tube (FIG. 9b, solid line spectrum). When the correct center frequency for this resonance is used during reconstruction (dotted line spectrum), no PPE2 is detected in that tube. The metabolic maps for all four resonances (FIG. 10) demonstrate similar resolution and localization properties as the FIDCSI images.

For a quantitative comparison of both spCSI acquisition schemes with FIDCSI, the mean image intensity from a region of interest (ROI) consisting of four voxels within each of the three tubes were calculated for each of the four resonances as shown in Table 1.

TABLE 1

Mean image intensity in the metabolic maps from an ROI in each of the three tubes for the three different CSI acquisitions.

| | Ala | | | Lac | | | PPE 1 | | | PPE 2 | | |
|---|---|---|---|---|---|---|---|---|---|---|---|---|
| | tube 1 | tube 2 | tube 3 | tube 1 | tube 2 | tube 3 | tube 1 | tube 2 | tube 3 | tube 1 | tube 2 | tube 3 |
| FIDCSI | 0.83 | 0.06 | −0.01 | 0.06 | 1.24 | 0.04 | −0.02 | 0.05 | 0.89 | 0.02 | 0.01 | 0.91 |
| single-shot. spCSI | 0.93 | 0.15 | 0.28 | 0.14 | 1.17 | 0.20 | −0.04 | 0.06 | 0.81 | 0.00 | −0.04 | 0.91 |

TABLE 1-continued

Mean image intensity in the metabolic maps from an ROI in each of the three tubes for the three different CSI acquisitions.

|  | Ala | | | Lac | | | PPE 1 | | | PPE 2 | | |
| --- | --- | --- | --- | --- | --- | --- | --- | --- | --- | --- | --- | --- |
|  | tube 1 | tube 2 | tube 3 | tube 1 | tube 2 | tube 3 | tube 1 | tube 2 | tube 3 | tube 1 | tube 2 | tube 3 |
| 3-shot. spCSI | 0.74 | −0.01 | 0.04 | −0.07 | 1.07 | 0.01 | −0.05 | 0.02 | 0.82 | −0.07 | 0.02 | 0.91 |

[a]The columns printed in bold indicate the tubes that contain the respective metabolite: Ala in tube 1, Lac in tube 2, and pyruvate-pyruvate hydrate ester in tube 3.

The ROIs are indicated in FIG. 6b-e. The data in columns printed in bold are the relative amplitudes of the four resonances as measured with the three CSI sequences. Non-zero values in the other two columns for each resonance indicate noise and/or artifacts. The relative difference in amplitude ratios as measured with single-shot spCSI compared to FIDCSI are 12% for Ala/PPE2, 6% for Lac/PPE2, and 9% for PPE1/PPE2. The respective values for 3-shot spCSI are 11% for Ala/PPE2, 14% for Lac/PPE2, and 8% for PPE1/PPE2. The overlap of the Ala and Lac resonances in the single-shot variant of spCSI combined with the distorted PSF for aliased frequency components leads to some artifacts for these two metabolites outside their respective tubes. Due to better spectral separation in the 3-shot acquisition scheme, the signal contamination outside the tube containing the respective metabolite are comparable to the FIDCSI data. The differences in amplitude ratios are mainly due to dispersion-mode signal contributions from aliased spectral components.

Figure 11:
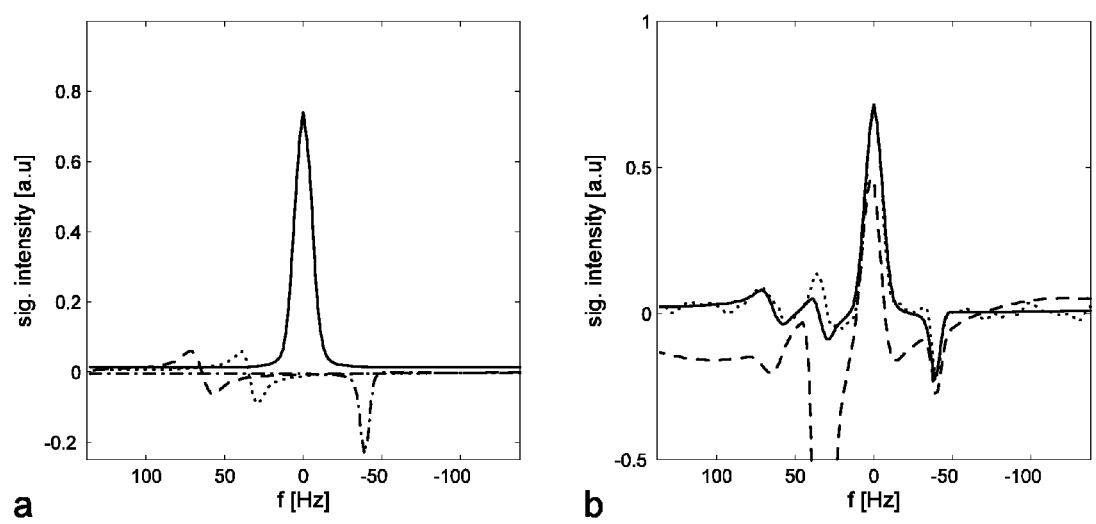
FIG. 11 illustrates (a) Individual spectral contributions of Lac (solid), Ala (dashed), PPE1 (dotted), and PPE2 (dashdotted) to a spectrum from a voxel in the Lac tube. The spectra were obtained by simulating the 3-shot spCSI sequence for a phantom mimicking the one used in the experiments. (b) Spectra from a voxel in the Lac tube simulated for the phantom with amplitude ratios as taken from the FIDCSI data (solid) and a 20-fold increased PPE1 signal (dashed). The measured spectrum is also shown (dotted).

These features are further illustrated in FIG. 11a by simulated spectra which show the individual contributions of the four spectral components to a spectrum for a voxel in tube 2 which contains only Lac. In an application such as the bolus injection of hyperpolarized pyruvate where the initial concentration of the substrate can be much larger than the concentrations of the metabolic products, these signal contributions could severely hamper the quantitation. Therefore, we simulated the 3-shot spCSI experiment for the same phantom but with the amplitude of the PPE1 resonance increased by a factor 20. FIG. 11b shows the resultant spectrum from a voxel in the Lac tube together with the spectrum simulated for the amplitude ratios taken from the FIDCSI data. An additional linear term was necessary in order to properly correct the phase of the Lac signal in the presence of the large PPE1 signal. The relative difference in the Lac concentration ratio as calculated in the two simulated spectra is 2%. Also shown in FIG. 11b is a spectrum from a voxel in the Lac tube as measured with 3-shot spCSI. It agrees well with the spectrum simulated with the FIDCSI amplitude ratios.

As described above, a fast spCSI technique has been developed for the special conditions present in hyperpolarized $^{13}$C metabolic imaging. The method takes advantage of the sparse spectral content by undersampling the data in the spectral domain in order to reduce the minimum measurement time. Prior knowledge of the detectable resonance frequencies in the sample is necessary for choosing the spectral width in order to avoid signal overlap due to aliased peaks. Note, that only the frequency differences between the spectral components determine the aliasing pattern. Hence, the method is not affected by frequency shifts between voxels due to B0 inhomogeneities as these offsets are the same for all resonances within a specific voxel. The chemical shift artifact, which results in a blurred PSF in spCSI, can not simultaneously be removed for spectral components that have been aliased a different number of times. Therefore, separate reconstructions for aliased frequency components have to be carried out.

This leads to multiple reconstructed data sets in which only components with resonance frequencies within a certain bandwidth are reconstructed "in-focus" while components outside of that band are severely blurred ("spectral tomosynthesis"). Consequently, these blurred components contribute signal beyond their true distribution as shown in the results for the 3-shot spCSI data. While all four resonances were resolved (the minimum frequency difference was 31 Hz with a maximum full-width at half-maximum of the peaks of 13 Hz), dispersion-mode signal contributions of aliased peaks from different voxels affect the calculation of peak intensities. At the same time, the blurred PSF makes it possible to distinguish the spatial distributions of otherwise severely overlapping resonances as demonstrated by the data acquired with a single spatial interleaf. While the current reconstruction performance is limited for quantitative mapping of metabolite distributions, it might be sufficient in an application which aims at localizing "hot spots" of metabolites. The artifacts due to the distorted PSF can potentially be reduced by using the prior knowledge of resonance frequencies, scalar coupling constants, and transverse relaxation times, and estimating the relative amplitudes with a minimum least-squares solution.

In a least squares reconstruction for sparse data and for a spectrum with known peaks, the signal as a function of time and k-space location can be expressed as $$y(k_x, k_y, t) = \sum_j M(k_x, k_y, v_j) e^{-i2\pi v_j t}$$

where $v_j$ are the known frequencies in the spectrum. For spiral CSI, in which a single k-space trajectory is repeated for a total of M echoes, the signal for each $k_x, k_y$ point can be written in matrix form as y=Am where y is a vector corresponding to the M observations of the $k_x, k_y$ point, m is a vector describing the spectral components of the point, and the elements of A are $$A_{mn} = e^{-i2\pi v_n (TE_m + \tau(k_x, k_y))}$$

Figure 12:
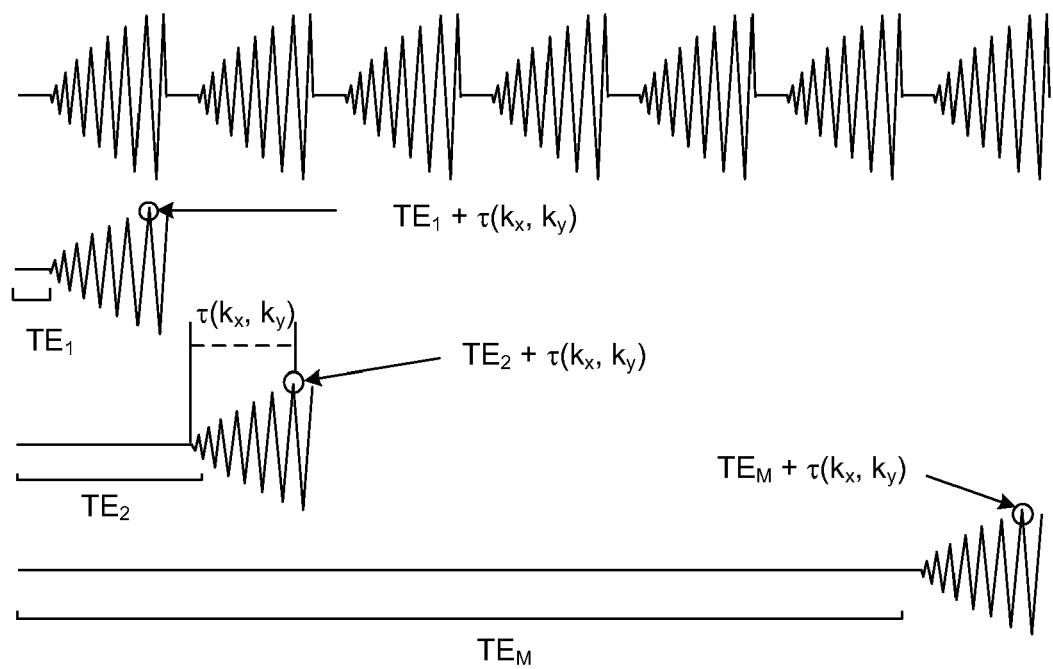
FIG. 12 illustrates a gradient waveform used with a least squares reconstruction with multiple echoes.

$\tau(k_x, k_y)$ is the time relative to the k-space origin. FIG. 12 depicts a gradient waveform used in the pulse sequence, with the full readout in the top row, and the readout divided into multiple echoes in the subsequent rows.

Any known information about the peaks, such as J-coupling and $T_2$ values, can be included in A. LS methods can be used to solve for m for each kspace point, and gridding can be performed to obtain metabolic images. The user is free to choose the echo times $TE_m$ subject to the FOV and resolution constraints of the desired images. In a technique similar to that proposed by Glover et al (MRM 18:371-383) for fat/ water separation and further developed by Reeder et al for IDEAL imaging (MRM 2004:51: 35-45), A can be optimized. Here, condition number is used to find optimal TE values and to determine the relative benefit of acquiring additional echoes. The least squares reconstruction is further described in Levin et al. "Least Squares Reconstruction for Sparse Spectra: Application to Hyperpolarized $^{13}$C Imaging", 14$^{th}$ Annual Meeting of the ISMRM, May 2006, which is incorporated herein by reference for all purposes.

In the case of imaging hyperpolarized samples, the initial longitudinal magnetization is not recoverable but instead it decays towards the undetectable thermal equilibrium level. Hence, lower flip angles have to be used in multi-shot experiments and there is no penalty in SNR for single-shot techniques. While a 90° pulse can be applied in a single-shot acquisition when imaging at a single time point, i.e., when all the magnetization should be used during the acquisition, the excitation flip angles in an n-interleaf spCSI experiment have to be adjusted in order to yield the same amount of transverse magnetization for each interleaf. Neglecting relaxation and metabolic turnover, the flip angle for the i$^{th}$ excitation pulse is then given by $\theta_i = \operatorname{atan}(1/\sqrt{n-i})$. If permitted by SNR, lower flip angles (<5-10°) should be applied when imaging in a dynamic time series in order to preserve the magnetization.

The development of very rapid hyperpolarized $^{13}$C metabolic imaging, as discussed above, potentially opens up a range of new applications including measurements of metabolic fluxes, bolus dynamics, and cardiac function. For example, for the latter application, it is highly desirable to restrict the acquisition time to less than 200 ms. This would allow the data to be acquired during diastole, thereby significantly reducing motion artifacts.

For metabolites with scalar coupling patterns similar to those used in our experiments, the lower spectral resolution associated with the short readout does not significantly reduce the ability to separate the individual resonances even in the case of long $T_2^*$s as the linewidth is dominated by the multiplet structure. For those applications in which the transverse relaxation time is much larger than $T_2^*$, the presented pulse sequence could be modified to refocus the transverse magnetization. It could then be either resampled or converted to longitudinal magnetization and excited again at a later time point.

While the invention has been described with reference to specific embodiments, the description is illustrative of the invention and is not to be construed as limiting the invention. Various modifications and applications may occur to those skilled in the art without departing from the spirit and scope of the invention as defined by the appended claims.

What is claimed is:

1. A method of imaging individual frequency components of systems with sparse spectra using magnetic resonance imaging comprising the steps of:
   a) exciting nuclei in a system with sparse spectra using a spiral Chemical Shift Imaging (CSI) pulse sequence,
   b) selecting a spectral window to minimize signal overlap of aliased frequency components, and
   c) detecting an individual frequency component within the spectral window wherein detecting includes acquiring data by sampling during the spiral CSI pulse sequence using the selected spectral window and reconstructing the acquired data.

2. The method of claim 1 wherein the nuclei are hyperpolarized.

3. The method of claim 1 wherein the system with sparse spectra comprises a hyperpolarized metabolically active substrate and the substrate's metabolic downstream products.

4. The method of claim 3 wherein the substrate is labeled with $^{13}$C.

5. The method of claim 4 wherein the substrate comprises $^{13}$C labeled pyruvate and the substrate's metabolic downstream products include lactate, alanine, and bicarbonate.

6. The method of claim 1, wherein reconstructing comprises applying spectral tomosynthesis.

7. The method of claim 1, wherein reconstructing comprises applying a least squares algorithm.

8. The methods of any of claims 1-5 or 6-7, wherein acquiring data comprises optimization using a least squares algorithm.

9. The method of claim 1 wherein the detecting step c) further comprises:
   acquiring data, using the spiral CSI pulse sequence, simultaneously along $k_x$, $k_y$, and $k_f$ directions in k-space, and
   applying a one-dimensional Fourier transform along the $k_f$ direction to the acquired data.

10. The method of claim 9 further comprising applying a frequency-dependent linear phase correction to the one-dimensional Fourier transformed data to remove a chemical shift artifact for the individual frequency component.

11. The method of claim 10 further comprising applying a gridding algorithm to interpolate the one-dimensional Fourier transformed data onto a Cartesian grid along the $k_x$ and $k_y$ directions in k-space.

12. The method of claim 11 further comprising the steps of:
   applying a two-dimensional Fourier transform along the $k_x$ and $k_y$ directions in k-space to the interpolated data, and
   generating a two-dimensional image of the individual frequency component by integrating the two-dimensional Fourier transformed data within a frequency band about a peak of the individual frequency component.

* * * * *